United States Patent
Bierhoff et al.

[11] Patent Number: 5,708,647
[45] Date of Patent: Jan. 13, 1998

[54] LASER POWER SUPPLY CIRCUIT AS WELL AS OPTION RECORDING AND/OR READING DEVICE COMPRISING SUCH A LASER POWER SUPPLY CIRCUIT

[75] Inventors: Martinus P. M. Bierhoff; Job F. P. Van Mil, both of Eindhoven, Netherlands

[73] Assignee: U.S. Philips Corporation, New York, N.Y.

[21] Appl. No.: 576,624

[22] Filed: Dec. 21, 1995

[30] Foreign Application Priority Data

Dec. 23, 1994 [EP] European Pat. Off. ............ 94203753

[51] Int. Cl.$^6$ ............................................. G11B 7/00
[52] U.S. Cl. .................. 369/116; 369/106; 369/44.25; 372/38
[58] Field of Search ................... 369/116, 106, 369/44.25, 44.31, 44.32, 44.35; 372/38, 26

[56] References Cited

U.S. PATENT DOCUMENTS

| | | | |
|---|---|---|---|
| 4,685,097 | 8/1987 | van der Put | 369/116 |
| 4,785,443 | 11/1988 | Minami et al. | 369/116 |
| 4,819,241 | 4/1989 | Nagno | 372/38 |
| 5,119,360 | 6/1992 | Minakuchi | 369/116 |
| 5,146,449 | 9/1992 | Shimozawa | 369/106 |
| 5,153,871 | 10/1992 | Minakuchi | 369/116 |
| 5,170,389 | 12/1992 | Numata et al. | 369/116 |

FOREIGN PATENT DOCUMENTS 2911858  10/1980  Germany.

*Primary Examiner*—Loha Ben
*Attorney, Agent, or Firm*—Leroy Eason

[57] ABSTRACT

A laser power supply control circuit may, when the power supply is initially turned on, temporarily permit an excessive supply voltage which may damage the laser. To prevent that, but without restricting the operating range or speed of response of the control circuit, the invention provides a sensing circuit for deriving a sensor signal indicative of a change in the loop gain of the control circuit when it departs from its normal operating mode. The sensor signal is used to prevent the power supply control signal from increasing excessively after a temporary reduction in supply voltage, but permits the control signal to operate substantially immediately when the supply voltage returns to its normal operating range.

10 Claims, 3 Drawing Sheets

LASER POWER SUPPLY CIRCUIT AS WELL AS OPTION RECORDING AND/OR READING DEVICE COMPRISING SUCH A LASER POWER SUPPLY CIRCUIT

BACKGROUND OF THE INVENTION

1. Field of the Invention

The invention relates to a laser power supply circuit comprising a control loop for controlling the intensity of radiation generated by a laser, the control loop comprising a driving circuit for supplying current to the laser, monitoring means for deriving a measuring signal indicative of the intensity, and a sensor control circuit for deriving a control signal for the driving circuit in response to the measuring signal.

The invention further relates to a device comprising a laser for recording and/or reading information on a record carrier, which device comprises such a laser power supply circuit.

2. Description of the Related Art

Such a circuit and device are known from U.S. Pat. No. 5,170,389. In the known circuit the laser is fed with a supply current via a transistor, the base current of the transistor being controlled by a control circuit in dependence on the laser radiation intensity as measured by a monitoring diode.

A problem with such a feedback laser power supply circuit is that the supply current may temporarily assume a high value on switch-on, damaging the laser.

SUMMARY OF THE INVENTION

It is an object of the invention, therefore, to reduce the probability of a damaged laser due to excessive supply current.

This object is achieved by a laser power supply circuit, having a sensing circuit for deriving a sensor signal indicative of a condition of the control loop, in which the loop gain deviates from the loop gain in an operational mode, and the control circuit comprises limiting means for limiting the control signal in response to the sensor signal.

The invention is also based on the recognition that in the case of a deviating loop gain the strength of the signals in the control loop may strongly deviate from the strength of these signals in an operational mode. This may cause the supply current flowing through the laser to become so large as to damage the laser. Another cause of too high a supply current flowing through the laser is that the control loop has a certain delay and, as a result, during adjustment to the operational mode after a transition from a deviating mode, there is temporarily such a large supply current as to damage the laser. The consequences of these two causes are combatted by the circuit according to the invention.

The invention is furthermore advantageous in that the control loop rapidly attains a state of balance once the operational mode has commenced.

An embodiment for the laser power supply circuit is characterized in that the sensing circuit comprises deriving means for deriving a sensor signal that indicates whether the loop gain is smaller than the loop gain in an operational mode.

A further embodiment is characterized in that the sensing circuit comprises deriving means for deriving a signal that is indicative of a loop gain deviation caused by the supply current as the sensor signal. This embodiment is advantageous in that no requirements need to be made on the rising and falling of the supply voltage of the laser power supply circuit.

A further embodiment is characterized in that the sensing circuit comprises deriving means for deriving a signal from at least one parameter that is directly representative of the control loop mode as the sensor signal. This is preferable to measuring an indirect condition such as, for example, the supply voltage, because no margins need to be maintained for the occurrence of, for example, specimen variation, temperature dependence, and so on. Due to the lack of such margins, the sensing circuit can be set in such a way that it will not limit the control signal until this is really necessary.

A further embodiment is characterized in that the deviation of the gain of the driving circuit, in essence, determines the deviation of the loop gain. This embodiment is advantageous in that when the driving circuit shows a minor gain in the deviating mode, the control loop will strongly increase the control signal, so that the supply current flowing through the laser will substantially assume an operational value. The control signal may be limited in a simple fashion, so that in that case a low supply current occurs during the deviating mode and, after the transition to the operational mode, the supply current increases from this low value to the operational value.

A further embodiment is characterized in that the sensing circuit comprises deriving means for deriving a signal that is indicative of a saturation state of the driving circuit as the sensor signal. In this embodiment the fact is used to advantage that the reduction of the gain of the driving circuit is generally caused by the saturation of the driving circuit, so that a detection of the saturation of the driving circuit will do for a detection of the reduction of the gain.

A further embodiment is characterized in that the driving circuit comprises a transistor and the sensing circuit comprises deriving means for deriving a signal from the voltage difference between collector and emitter of the transistor as the sensor signal. In this embodiment the fact is used to advantage that the saturation may be derived from the collector-emitter voltage of a transistor. This embodiment likewise has the advantage that it can be incorporated in an IC that also includes the driving transistor.

A further embodiment is characterized in that the control circuit comprises integrating means for integrating a difference between a reference signal and the measuring signal, and adjusting means for making adjustments in dependence on the integrated difference, and in that the control circuit comprises limiting means for limiting the integrated difference in response to the sensor signal. In an integrating-action control loop the problem of very large control signals being built up increasingly occurs after a transition from a deviating mode to an operational mode, because the integrator causes a long delay to occur in the control loop. By limiting the integrated difference, the build-up of a large control signal once the operational mode has set in is avoided in a simple manner and so is incapable of damaging the laser.

A further embodiment is characterized in that the control circuit comprises reducing means for reducing said difference between the reference signal and the measuring signal. This embodiment is furthermore preferable to the reduction of the integrated difference in that after a temporary reduction of the supply voltage, the desired control signal reemerges substantially immediately.

An embodiment of a device comprising a laser for recording and/or reading information on/from a record carrier is characterized in that the device comprises a laser power supply circuit as described above for feeding the laser. This embodiment is advantageous in that the reliability of the laser is enhanced and in that the design of the power supply circuit of the device may be simpler and more cost-effective, because no restrictive requirements are made on the rise and fall of the supply voltage.

BRIEF DESCRIPTION OF THE DRAWINGS

The invention will be further explained in the following with reference to the drawing FIGS. 1 to 6, in which.

In the drawing Figures elements corresponding to elements already described carry like reference characters.

DESCRIPTION OF THE PREFERRED EMBODIMENTS

Figure 1:
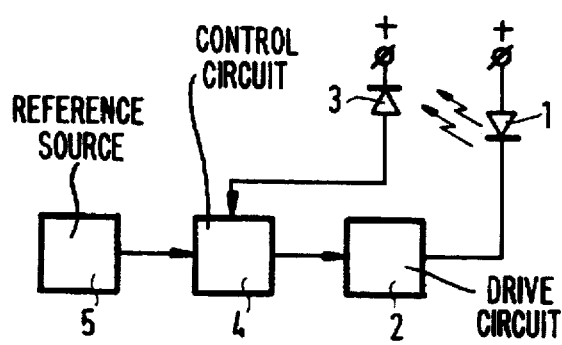
FIG. 1 shows a block diagram of a laser power supply circuit.

FIG. 1 shows a laser power supply circuit in which the laser 1, for example, a semiconductor laser, is supplied with a supply current by a driving circuit 2. Part of the generated radiation is captured by a radiation-sensitive detector 3, for example, a monitoring diode. The measuring signal from detector 3 is compared in a control circuit 4 with a reference signal coming from reference signal source 5. The control circuit 4 produces a control signal that indicates the result of the comparison. This control signal is applied to the driving circuit 2. In this manner a control loop is formed by the laser 1, the optical path between the laser 1 and the detector 3, the detector 3, the control circuit 4, the reference signal source 5 and the driving circuit 2. The control loop brings the intensity of the generated radiation to a certain value which is determined by reference signal source 5 and the parameters of the detector 3 when the radiation intensity is converted into the measuring signal. Albeit the current flowing through the laser 1 presents a strongly non-linear and temperature-dependent relation with the radiation intensity, a desired intensity is still obtained. In such a circuit the laser 1 may become damaged when the current flowing through the laser 1 becomes excessive. This may occur, for example, if the control loop is in a nonoperational mode. For example, if the optical path between the laser 1 and the detector 3 is interrupted, the control circuit 4 will continue to increase the control signal and thus, via the driving circuit 2, increase the current flowing through the laser 1 to an excessive value. In general, the control loop may render the current too large if the control loop is in a mode in which the a loop gain differs from the loop gain in operational mode.

Figure 2:
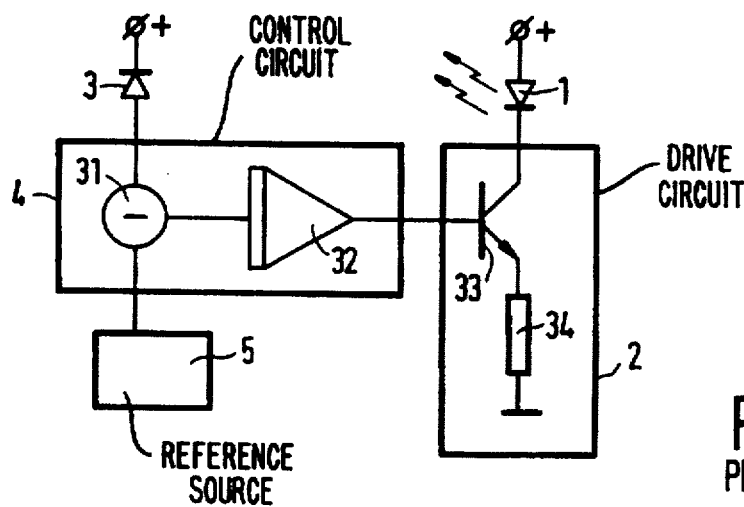
FIG. 2 shows a known laser power supply circuit.

FIG. 2 shows an embodiment for a state-of-the-an laser power supply circuit in which the control circuit 4 comprises a subtracter 31 and integrator 32. The subtracter 31 determines the difference between the current leaving the reference signal source 5 and the current flowing through the monitoring diode 3. The difference signal is applied to the input of integrator 32 which generates the control signal from the integrated total and applies the control signal to the driving circuit 2. The driving circuit 2 comprises a driving transistor 33 whose base forms the input and whose emitter is connected to ground via emitter resistor 34. The collector produces the current for the laser 1. The integrated total in integrator 32, and thus the laser intensity will adjust in such a way that the difference signal on the input of the integrator 32 becomes zero. In such a laser power supply circuit the laser 1 will initially not produce any radiation when the supply voltage rises, because the laser 1 will not operate until a specific minimum operating voltage is reached. The integrator 32, however, does start to integrate immediately while a difference signal on the input is maximized, because no current leaves the detector 3 as yet. The control signal will continue to rise at a maximum rate as long as the laser 1 does not produce any radiation. When the supply voltage has risen to such an extent that the minimum working voltage on the laser 1 is reached, the laser 1 will start to operate. With a further rise of the supply voltage, the laser 1 may temporarily be supplied with too large a supply current, because a large control signal has been built up in the integrator 32. The laser intensity and thus the current leaving the detector 3 now exceeds the operational value. The integrator 32 has a certain delay and, therefore, the large control signal will be decreasing for a long time before the control loop reaches an operational state of balance. During this period of time the laser 1 is supplied with a large supply current.

Figure 3:
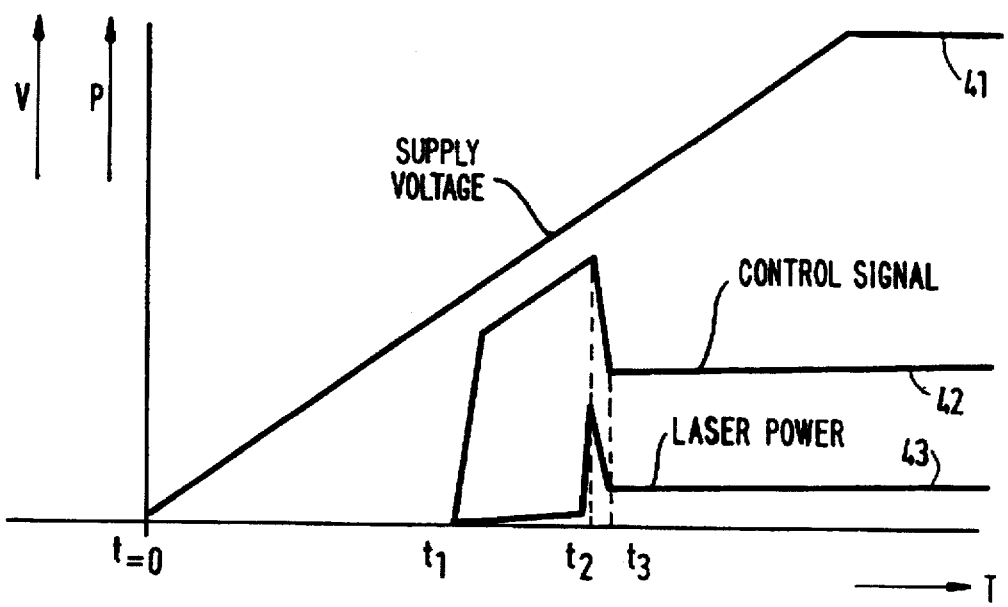
FIG. 3 shows curves of the laser power with an increasing supply current.

FIG. 3 shows a graph in which curve 41 shows the supply voltage, curve 42 the control signal and curve 43 the laser power. Time T is shown along the horizontal axis and voltage V and power P along the vertical axis. FIG. 3 gives an example in which the supply voltage in the laser power supply circuit of FIG. 2 rises from zero to the fully operational supply voltage. From instant t0 the supply voltage rises according to curve 41; at instant t1 the integrator starts to operate and the control signal rises according to curve 42 and at instant t2 the supply voltage has risen sufficiently to let the laser power rise according to curve 43. Between the instants t2 and t3 the integrator 32 will reduce the control signal 42, it is true, but not fast enough, so that a high laser power is developed as a result of which the laser may be damaged. After t3, the control loop is in an operational state of balance. At the transition from a state of deviating loop gain (before t2) to a state of balance (after t3) there is thus too large a current flowing inside the laser.

A possible solution for avoiding the occurrence of too large a current flowing through laser 1 is the limitation of this current in the driving circuit 2. However, this is detrimental in that this likewise limits the dynamic range of the driving circuit 2. In addition, the maximum permissible current flowing through a laser 1 strongly depends on the temperature and the time for which this current is applied. As a result, such a current limiting circuit restricts the possible modulation of the laser intensity and, therefore, the circuit becomes complex and expensive.

Another solution is a circuit in which the maximum current is limited by the laser 1, because the laser 1 is temporarily extinguished completely, for example, by short-circuiting of the laser 1 itself. Such a circuit does combat the symptoms of too large a control signal, it is true, but as long as the cause continuous to occur, the control loop will raise the level of the control signal even further. After the operational mode has commenced, there is a great probability of the laser 1 being damaged and it will take a long time for the control loop to end up in a state of balance.

Figure 4:
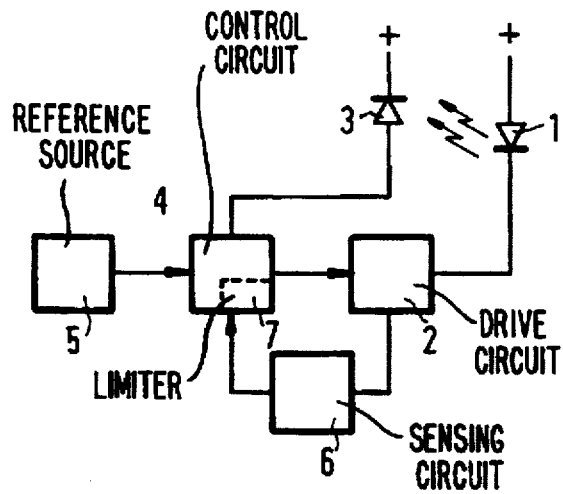
FIG. 4 shows a block diagram of a laser power supply circuit comprising a sensing circuit.

With reference to FIG. 4 will be described an embodiment for the laser power supply circuit according to the invention which circuit does not present said detrimental effects.

FIG. 4 shows a laser power supply circuit as shown in FIG. 1, to which a sensing circuit 6 is added. The sensing circuit 6 derives a sensor signal which is indicative of a mode of the control loop, in which the control loop has a loop gain different from the loop gain in operational mode. The control circuit 4 comprises limiting means 7 for limiting the control signal as a function of this sensor signal. The sensing circuit 6 may acquire the sensor information from the driving circuit 2 as shown, but also from another pan of the control loop. For this purpose, that part of the control loop that essentially determines the deviation of the loop gain is to be used. For example, if it is known that for the present circuit the reference signal source 5 may produce too large a signal in a non-operational mode, the sensing circuit 6 may obtain the sensor information from the reference signal source 5. In another example the reference signal source 5 provides an input signal whose mean intensity is converted in the control circuit 4 into a desired radiation intensity of the laser 1 by an automatic gain control (AGC). If the input signal is completely absent, the AGC will drive to maximum gain and the control loop will have a loop gain that differs from the operational mode. When the input signal rises or is connected, the current flowing through the laser will briefly be too large, because the AGC control has a certain delay. The sensing circuit 6 is in that case to react to the absence of the input signal or the fact that the gain by the AGC is increasingly enhanced. The control circuit 4 may inhibit, for example, the adaptation of the gain by the AGC if the sensor information denotes that there is no input signal present. If the monitoring diode 3 receives less radiation than is generated by the laser 1 in the operational mode, for example, because the optical system is not yet operational or the supply voltage of the particular servosystems is still insufficient, the sensing circuit 6 is to react to this. It may measure, for example, the particular supply voltage or react to error signals coming from the focusing servo system. However, preferably a parameter of the circuit, which parameter is directly representative of the control loop mode, is measured as the element that is known in essence to determine the deviation in loop gain. In many embodiments this element will be the driving circuit because of the minimum voltage necessary across the laser and the relatively large current. If the driving circuit 2 has a small gain at a low supply voltage, this supply voltage could be measured as a parameter by the sensing circuit 6. In practice, however, there may be a large variation in the properties of the laser and of the components in the driving circuit 2, so that a large margin is to be allowed by the sensing circuit 6 and therefore it may often act prematurely. Therefore, it is better to derive a sensor signal that depends directly on the gain of the driving circuit 2, for example, on the ratio between the control signal on the input and the current on the output, or on the saturation of the driving circuit.

Figure 5:
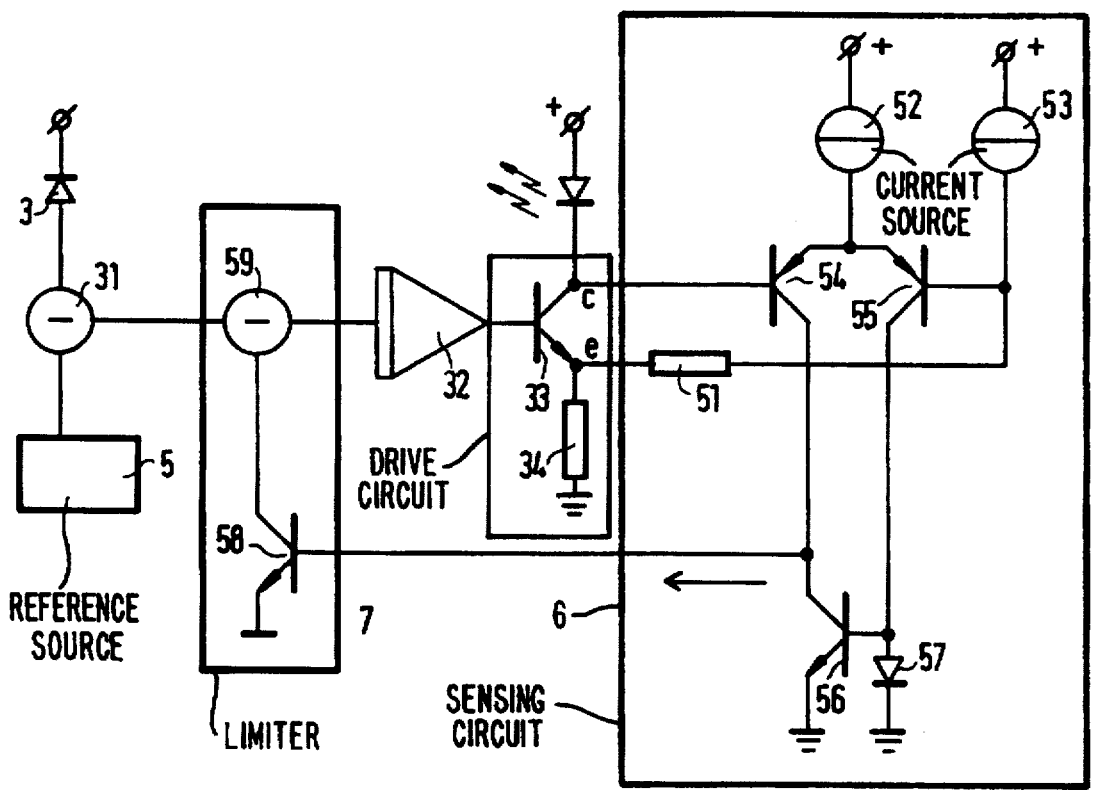
FIG. 5 shows an embodiment of the invention having a sensing circuit in laser power supply circuit and FIG. 6 shows a device for recording and reading information which device includes a laser power supply circuit in accordance with the inventor.

FIG. 5 shows an embodiment for a sensing circuit according to the invention included in the laser power supply circuit shown in FIG. 2. The sensing circuit 6 comprises a differential amplifier which includes current source 52 which is connected to the two emitters of the transistors 54 and 55. The first input is the base of transistor 54 which is connected to the collector of transistor 33 in the driving circuit 2. At a second input the emitter of transistor 33 is connected to resistor 51 through which resistor the base of transistor 55 is brought to a fixed voltage beyond the emitter voltage of transistor 33 by the fixed current from current source 53. The collector of transistor 55, which collector is coupled to the output via a current mirror circuit, is connected to the anode of diode 57 and base of transistor 56, whose cathode and emitter respectively, are connected to ground. The output of the sensing circuit 6 is at the common connection of the collector of transistor 54 and the collector of transistor 56. This output is connected to the base of transistor 58 whose emitter is connected to ground and whose collector is connected to subtracter circuit 59. The control circuit limiter 7 comprises the elements 58 and 59 for reducing the input signal of integrator 32, which is, the difference between the measuring signal and the reference signal. A reduction of the control signal may also be effected by short-circuiting the integration element. After a temporary reduction of the supply voltage and the consequent shortcircuiting, the integrator will then have to build up the charge in the integration element from zero. As a result, the control loop will be unbalanced for a rather long period of time. If, on the other hand, the current on the input of the integrator is reduced, as in the embodiment shown, the integrator will rapidly have regained the desired control signal after such a temporary reduction of the supply voltage. The sensing circuit 6 senses whether the voltage between the collector and the emitter of driving transistor 33 is smaller than the voltage across resistor 51, while the latter voltage is determined by the current flowing from current source 53. The collector/emitter voltage of transistor 33 will be small if this transistor is strongly driven on the base and is therefore in saturation. When this saturation occurs, the differential gain from base current to collector current becomes very small and the collector/emitter voltage is thus indicative of a deviating gain of the driving circuit. The sensing circuit 6 generates a sensor signal on the base of transistor 58, which transistor now prevents the control signal on the output of the control circuit from further increasing. When transistor 58 is turned on, the difference current will flow from subtracter 31 through subtracter 59 and transistors 58 and so the integrator 32 does not allow the control signal to rise any further. The resistor 34 in the driving circuit 2, which in the state of the art is included as a simple current limiter, may now be very small, or even 0 Ohms due to the presence of the sensing circuit 6. Consequently, the range over which the driving circuit 2 can be driven to full power is enhanced and unnecessary voltage and power loss is avoided, which is of importance especially in battery-fed equipment.

In further embodiments, a parameter in another part of the circuit or other ambient conditions may be indicative of a transient mode in which an excessive control signal may build up in the control circuit 4. In that case, for example, the gain in another part of the control loop, the lack, or temporary interruption of the measuring signal, indicative of the laser intensity, the presence of external control signals or an erroneous reference signal, may form the basis of the sensor information. The invention is not restricted to said embodiments and parameters presented for deriving the sensor signal therefrom.

Figure 6:
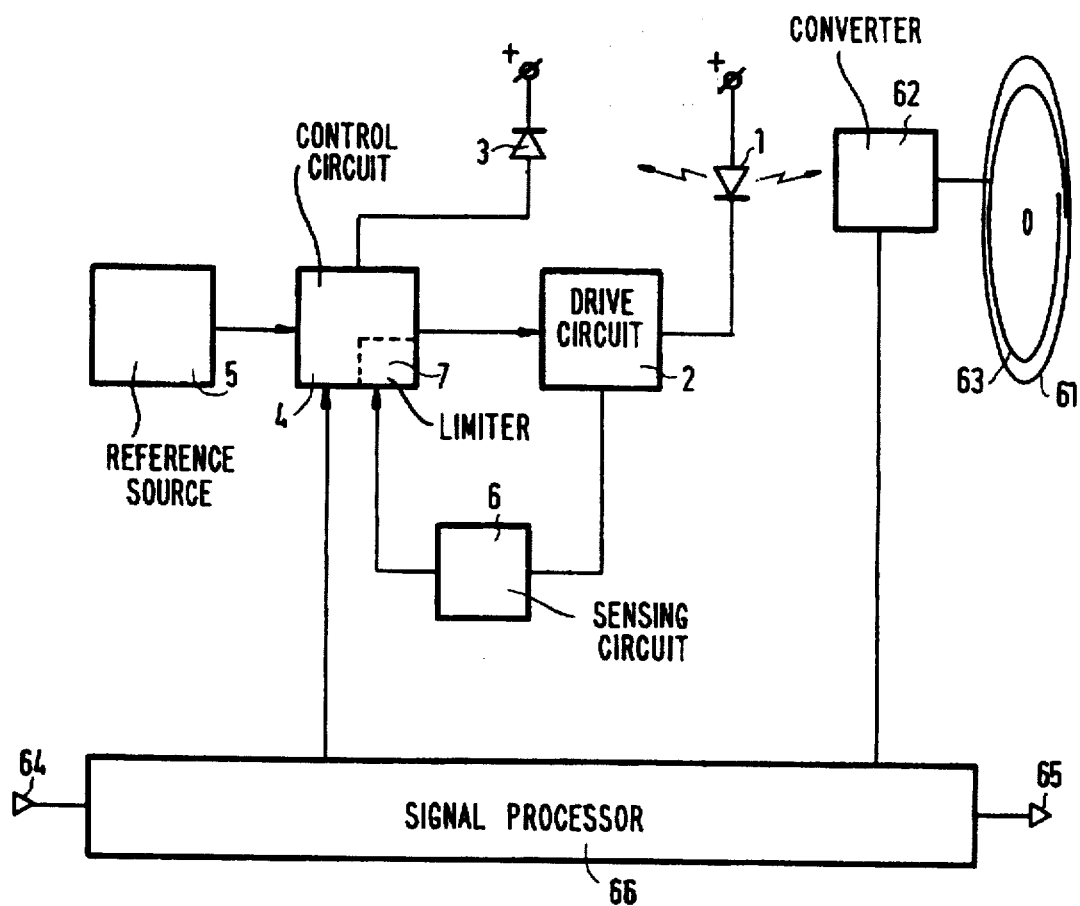

FIG. 6 shows a device for recording and reading information, which device comprises a laser power supply circuit according to the invention. The radiation generated by the laser 1 is focused on a disc-like information carrier 61 by an opto-electric converter 62, on which information carder 61 is recorded an information pattern in helical track 63. For this purpose, the information carrier 61 rotates and the converter 62 is radially displaced by a servosystem (not shown). A signal processing unit 66 processes the input signal of input 64 into a modulation signal, which is applied to the control circuit 4, and thereby modulates the intensity of laser 1, so that the information pattern is recorded in track 63. When track 63 is read, the reflected radiation of laser 1 is modulated by the information pattern and converted into an information signal by converter 62 and applied to signal processing unit 66. This unit reconstitutes the information from the information signal and supplies this information on output 65.

The invention is not restricted to the embodiment shown, but may likewise be used, for example, in devices exclusively meant for recording or reading and for other information carriers, such as tape-like information carriers. Furthermore, the invention may be applied to all sorts of information recording, reading and transmission in which a laser is used, such as, for example, magneto-optical or photographic recording and reading or transmission through glass fibres.

What is claimed is:

1. A laser power supply circuit comprising a control loop for controlling an intensity of radiation generated by a laser, the control loop comprising a driving circuit for feeding the laser, monitoring means for deriving a measuring signal indicative of the intensity, and a control circuit for deriving a control signal for the driving circuit in response to the measuring signal; said power supply circuit further comprising a sensing circuit for deriving a sensor signal indicative of a mode of the control loop in which a loop gain deviates from the loop gain in an operational mode, and wherein the control circuit comprises means for limiting a maximum value of the control signal in response to the sensor signal.

2. A laser power supply circuit as claimed in claim 1, wherein the sensing circuit comprises means for deriving a signal that indicates whether the loop gain is smaller than the loop gain in said operational mode as the sensor signal.

3. A laser power supply circuit as claimed in claim 1, wherein the sensing circuit comprises means for deriving a signal that is indicative of a loop gain deviation caused by the driving circuit as the sensor signal.

4. A laser power supply circuit as claimed in claim 1, wherein the sensing circuit comprises means for deriving a signal from at least one parameter that is directly representative of the control loop mode as the sensor signal.

5. A laser power supply circuit as claimed in claim 1, wherein a deviation of the gain of the driving circuit, substantially determines the deviation of the loop gain.

6. A laser power supply circuit as claimed in claim 5, wherein the sensing circuit comprises means for deriving a signal that is indicative of a saturation state of the driving circuit as the sensor signal.

7. A laser power supply circuit as claimed in claim 6, wherein the driving circuit comprises a transistor and the sensing circuit comprises means for deriving a signal from the voltage difference between the collector and emitter of the transistor as the sensor signal.

8. A laser power supply circuit as claimed in claim 1, wherein the control circuit comprises integrating means for integrating a difference between a reference signal and the measuring signal making adjustments of the control signal in dependence on the integrated difference, and the control circuit comprises limiting means for limiting the integrated difference in response to the sensor signal.

9. A laser power supply circuit as claimed in claim 8, wherein the control circuit comprises means for reducing said difference between the reference signal and the measuring signal.

10. A device comprising a laser for recording and/or reading information on/from a record carrier, wherein the laser is driven by a laser power supply circuit as claimed in claim 1.

* * * * *